United States Patent [19]

Homma et al.

[11] Patent Number: 4,710,398

[45] Date of Patent: Dec. 1, 1987

[54] SEMICONDUCTOR DEVICE AND MANUFACTURING METHOD THEREOF

[75] Inventors: Yoshio Homma; Takashi Nishida, both of Tokyo, Japan

[73] Assignee: Hitachi, Ltd., Tokyo, Japan

[21] Appl. No.: 900,523

[22] Filed: Aug. 26, 1986

[30] Foreign Application Priority Data

Sep. 6, 1985 [JP] Japan .................................. 60-195837

[51] Int. Cl.$^4$ .......................................... H01L 21/285
[52] U.S. Cl. .............................. 437/235; 204/192.17; 437/245
[58] Field of Search ............................ 427/89, 90, 91; 204/192.17

[56] References Cited

U.S. PATENT DOCUMENTS

| | | | |
|---|---|---|---|
| 4,378,383 | 3/1983 | Moritz | 427/91 |
| 4,415,606 | 11/1983 | Cynkar | 427/91 |
| 4,532,702 | 8/1985 | Gigante | 427/91 |
| 4,566,026 | 1/1986 | Lee | 427/89 |
| 4,582,563 | 4/1986 | Hazuki | 427/91 |
| 4,592,802 | 6/1986 | Deleonibus | 427/90 |
| 4,624,864 | 11/1986 | Hartmann | 427/90 |

OTHER PUBLICATIONS

Moriya et al, "A Planar Metallization Process—Its Application to Tri-Level Aluminum Interconnection", Technical Digest of IEDM, (1983), pp. 550–553.

*Primary Examiner*—John D. Smith
*Attorney, Agent, or Firm*—Antonelli, Terry & Wands

[57] ABSTRACT

A method of manufacturing a semiconductor device. An insulation film having an opening is formed on a semiconductor substrate. The opening is filled with an electrically conductive material so as to substantially flatten the top surface of the opening filled with an electrically conductive material, an intermediate layer of an electrically conductive material having a greater allowable current density than that of a wiring layer to be formed thereon is formed so as to cover at least their surface of the electrically condictive material deposited in the opening. Subsequently, the wiring layer is formed so as to extend from the surface of the intermediate layer onto the surface of the insulation film. A semiconductor device incorporating the wiring layer having an extremely high reliability can be easily realized.

10 Claims, 4 Drawing Figures

SEMICONDUCTOR DEVICE AND MANUFACTURING METHOD THEREOF

BACKGROUND OF THE INVENTION

The present invention generally relates to a method of manufacturing a semiconductor device. In particular, the invention is concerned with a semiconductor device manufacturing method which makes it possible to form a wiring layer having a large current capacity in a facilitated manner.

In accompaniment to the tendency of the semiconductor device being implemented with more and more increasing integration density, dimensions of wiring conductors or layers realized in the semiconductor device tend to become extremely reduced. Additionally, a so-called multi-layer wiring technique is increasingly adopted in which a plurality of wiring layers are stacked in a laminated structure with an insulation film being interposed between the adjacent wiring layers.

Use of the fine wiring conductors or layers and the multi-layer wiring structure in the semiconductor device is however accompanied with several problems.

For having a better understanding of the background of the invention, discussion will be made in some detail by referring to FIG. 1 of the accompanying drawings on the problems which the hitherto known wiring technique suffers. FIG. 1 shows a typical one of the conventional wiring structures such as disclosed, for example, in "Technical Digest of IEDM", (1983), p.p. 550 to 553. Referring to the figure, a silicon substrate 10 has formed thereon a lower wiring layer 11 formed, for example, of an Al-Si alloy on which a SiO$_2$-film 12 is formed as an inter-layer insulation film. The SiO$_2$-film 12 has a contact hole 13 formed therethrough at a predetermined position. The contact hole 13 is filled with tungsten (W) as denoted by a numeral 14 through a selective vapor growth process. The tungsten contact 14 burried in the contact hole 13 exhibits a high allowable current density and is effective for enhancing the reliability. An upper wiring layer 15 is additionally formed on the inter-layer insulation film 12, whereby a multi-layer wiring structure is realized.

Although the metal 14 filling the contact hole 13 in the hitherto known wiring structure can ensure an enhanced reliability as mentioned above, it is noticed that the allowable current density at contact regions 13a and 13b located between the metal body 14 filling the contact hole 13 and the upper wiring layer 15 and the lower wiring layer 11, respectively, is limited by the allowable current density of the materials which constitute the upper and lower wiring layers. As a consequence, the metal such as W deposited in the contact hole 13 can not necessarily lead to the improvement of realiability of the wiring, giving rise to a problem.

SUMMARY OF THE INVENTION

It is an object of the present invention to solve the problem of the prior art and provide a method of manufacturing a semiconductor device which method allows the wiring having a significantly high reliability to be formed in a facilitated manner.

Another object of the present invention is to provide a method of manufacturing a semiconductor device which method is capable of forming wiring layers overlying and underlying a contact, respectively, and having an increased realiability in a facilitated way.

Still another object of the invention is to provide a semiconductor device incorporating a wiring structure enjoying an improved reliability.

In view of the above and other objects which will be apparent as description proceeds, there is provided according to an aspect of the invention a method of manufacturing a semiconductor device which includes a step of filling a contact hole formed in an insulation film with an electrically conductive material and flattening substantially the top end face of the filled material, a step of covering at least a part of the top surface of the contact hole with an intermediate layer formed of one of transition metals or an alloy thereof or a compound thereof having a higher allowable current density than that of a wiring pattern to be formed thereon, the intermediate layer having a greater area than that of the contact hole, and a step of forming the wiring pattern layer on the intermediate layer. With the wiring structure thus realized, the current flowing out from the contact hole is diffused in the intermediate layer and subsequently flows in the wiring pattern layer formed on the intermediate layer. Accordingly, the current density at the contact portion between the intermediate layer and the wiring pattern layer becomes extremely low, whereby the reliability of the wiring at the contact hole can be significantly increased.

DESCRIPTION OF THE PREFERRED EMBODIMENTS

In the following, the invention will be described in detail in conjunction with illustrative or exemplary embodiments.

EXAMPLE 1

Figure 1:
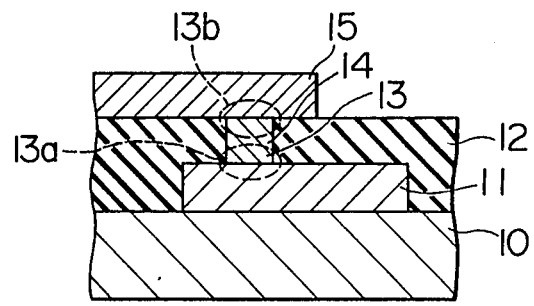
FIG. 1 is a sectional view showing a hitherto known wiring structure in a semiconductor device.
Figure 2:
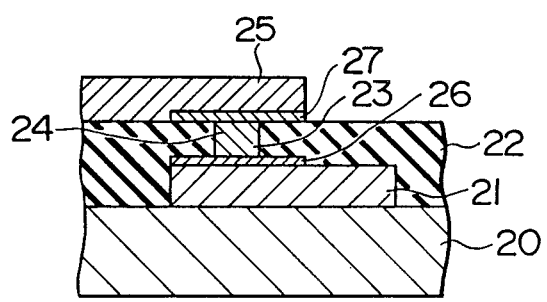
FIGS. 2, 3 and 4 are views showing varieties of wiring structures according to illustrative embodiments of the invention, respectively.

Reference being made to FIG. 2, a lower wiring layer 21 was formed of an Al-Si alloy containing 1% of Si in a thickness of 1 $\mu$m on a substrate 20 of Si or the like having an insulation film formed on the surface. (Parenthetically, although impurity-doped region is formed in the surface region of the substrate 20, it is omitted from illustration in the drawing, because it bears no direct relationship to the present invention.) A tungsten or W-film 26 of 0.2 $\mu$m in thickness was formed as a lower intermediate layer by a known sputtering or CVD method at a location where a contact hole 23 is to be formed. Subsequently, a SiO$_2$-film 22 of 2 $\mu$m in thickness was formed by a well known CVD method as an inter-layer insulation film, whereupon the contact hole 23 having a diameter of 1 $\mu$m was formed in this SiO$_2$-insulation film 22. The contact hole 23 was filled with an aluminum alloy containing 1% of Si by a CVD or bias-sputtering method. Subsequently, through a sputtering method, a Mo-film 27 having a thickness of 0.2 $\mu$m was formed as an upper intermediate layer so as to cover the top surface of the metal-filled contact hole 23 and the surface region of the SiO$_2$-film 22 located in the vicinity of the contact hole 23. Formed on the film 27 was an Al-alloy film containing 1% of Si in a thickness of 1 $\mu$m as an upper wiring layer 25. The Mo-film 27 and the W-film 26 formed, respectively, on the top and bottom end faces of the contact hole 23 each had an area about thrice as large as that of the contact hole 23. When both the W-film 26 and Mo-film 27 are absent, the current which can flow through the contact hole 23 is about 1 mA at highest. In contrast, it has been found that when the Mo-film 27 and the W-film 26 are formed on the top and bottom end faces of the contact hole 23, respectively, the allowable current density can be increased, whereby the current on the order of 2 mA or higher can flow through the contact hole. Now, the lower W-film 26 may be patterned by a lithography or etching step for the lower wiring layer 21. Also, the upper W-film 27 may be patterned by a lithography or etching step for the upper wiring layer 25. In this case, the allowable current density can be also increased to the order of 2 mA.

EXAMPLE 2

Figure 3:
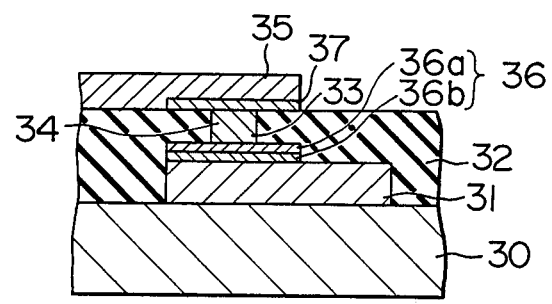

Reference is made to FIG. 3. The substrate 30, the inter-layer insulation film 32 and the material filling the contact hole 33 as well as geometrical factors of these parts were same as those described above in conjunction with the preceding example. An upper wiring layer 35 and a lower wiring layer 31 were each formed of an Al-alloy film containing 3% of Cu in a thickness of 1 $\mu$m. A lower intermediate layer 36 formed through a known vapor-deposition or sputtering method was of a two-layer structure having a first layer 36b of TiN formed through sputtering in a thickness of about 0.2 $\mu$m and a second layer 36a formed of MoSi$_2$ in a thickness of about 0.1 $\mu$m. Subsequently, the contact hole 33 was filled with tungsten (W) 34 deposited therein through a selective vapor growth method. A TiN-film of 0.2 $\mu$m in thickness was formed as an upper intermediate layer 37. The upper and lower intermediate layers 37 and 36 have each an area which is five times as large as that of the contact hole 33 and are arranged such that opposite surfaces of the tungsten 34 are covered by the intermediate layers.

In the case of the instant example, the allowable current can be increased about thrice as high when compared with the preceding example because the Al-alloy containing 3% of Cu which exhibits a high allowable current density is used for forming the lower and upper wiring layers 31 and 35. Besides, by virtue of the upper and lower intermediate layers 37 and 36b formed of TiN, heat-proofness is increased, which is advantageous in that no structural change can occur during heat treatment at a temperature of about 500° C. Although the second lower intermediate layer 36a formed of MoSi$_2$ is provided primarily with the intention to improve the electric contact between the W-contact 34 and the TiN-film 36b upon filling the contact hole 33 with W through vapor growth, the laminated structure of the lower intermediate layer of the TiN-film 36b and the MoSi$_2$-film 36a brings about another advantageous effect that the sheet resistance is reduced to enhance the current diffusing effect.

EXAMPLE 3

In the preceding examples 1 and 2, the wiring layers are provided, respectively, above and beneath the contact hole. In the case of the instant example, the wiring layer is provided only above the contact hole.

Figure 4:
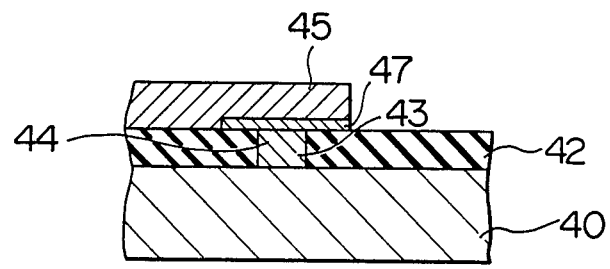

More specifically, referring to FIG. 4, a SiO$_2$-film 42 is formed through a known thermal oxidation on the surface of a semiconductor substrate 40 in which an impurity-doped regions (not shown) was formed. This insulation film 42 was selectively etched at a desired location by a known etching method to form a contact hole 43 so that the impurity-doped region was exposed therethrough.

Subsequently, the contact hole 43 was filled with an Al-Si alloy containing 1% of Si through CVD or bias sputtering process. The top end of the alloy contact thus formed was substantially flattened, being followed by formation thereon of an intermediate film of Mo in a thickness of 0.2 $\mu$m and a wiring layer 45 of a Al-Si alloy containing 1% of Si in a thickness of 1 $\mu$m through sputtering and CVD methods, respectively.

Also in the case of the instant example, the allowable current can be increased about twice that of the conventional structure in which the Mo-film 47 is not interposed between the wiring layer 45 and the alloy 44 filling the contact hole. It should be added that the area of the Mo-film 47 was about thrice as large as that of the contact hole. In a case that the areas of the Mo-film is more larger than thrice as large as that of the contact hole and the Mo-film and the wiring layer are patterned simultaneously, the allowable current can also be increased to about twice that of the conventional structure.

As will be understood from the above description of the examples, an important feature of the present invention can be seen in that the contact hole is filled with an electrically conductive material and that after flattening the top end face of the contact hole thus formed, an intermediate film is formed of an electrically conductive material having a higher allowable current density than that of a wiring layer formed subsequently on the intermediate layer.

The intermediate layer mentioned above should have a larger area than that of the contact hole so that the top end thereof is completely covered by the intermediate layer. If the area of the intermediate layer is smaller than that of the contact hole and a part thereof remains uncovered by the intermediate layer and the uncovered area contacts with the lower or upper wiring layer directly, there may occur concentration of electric field at that part, involving thus the possibility of the wiring reliability being undesirably remarkably degraded.

For filling the contact hole according to the teaching of the invention, numerous electrically conductive materials may be employed. By way of example, transition metals Ti, Zr, Ta, Mo and others or various alloys and nitrides of these transition metals, various Al-alloys inclusive of Al-Cu alloy, Al-Ti alloy and Al-Ta alloy may be enumerated in addition to tungsten and Al-Si alloy employed in the examples described above. These electric materials can be deposited within the contact hole by a known method such as CVD, sputtering, bias sputtering or vacuum evaporation method which may be selected appropriately in dependence on the type of the electrically conductive material and the size of the holes as used.

The intermediate layer may be formed of a transition metal such as Mo, Ti, Zr, Ta, Co, Cr or one of various alloys and nitrides of these transition metals or Al-Ti alloy or Al-W alloy in addition to W and TiN employed in the examples described above. Besides, noble metal such as Au and Pt may be used although the manufacturing cost will then be correspondingly increased. The film formed of the material mentioned above may be realized in a multi-layer structure including two or more laminated layers, although it can be implemented in a single-layer structure. When the intermediate layer is to be formed beneath the contact hole in addition to the overlying one, both the intermediate layers may be formed either of a same material or different materials. In the case of the examples described above, the intermediate layer is formed on the contact hole and over the region located in the vicinity thereof. However, the intermediate layer may further extend over the insulation layer so as to be interposed wholly between the wiring layer and the insulation layer. The wiring layer may be formed of a given one of various wiring materials such as Al, Al-Si alloys or Al/Ta/Al. The common feature of these wiring materials is that they mainly consist of alminum.

The thickness of the intermediate layer should preferably be greater than ca. 500 Å. When this thickness is less than 500 Å pin holes are likely to be formed, bringing about difficulty in forming the intermediate layer having a high reliability. However, since excessively great thickness will be accompanied with a correspondingly increased electric resistance of the wiring, the thickness of the intermediate layer should preferably be smaller than about 20% of that of the wiring layer formed on the insulation film. It goes without saying that the intermediate layer can be realized by a known appropriate method such as CVD, sputtering, bias sputtering or vacuum evaporation method.

As will now be appreciated from the foregoing description, the present invention teaches that the contact hole formed in an insulation film is filled with an electrically conductive material and after flattening the top end of the contact hole thus formed, an intermediate layer is formed of a material having a greater allowable current density than that of a wiring layer so as to cover the top end face of the contact, being followed by formation of the wiring layer. According to the teaching of the invention, a semiconductor device incorporating a wiring structure having far higher reliability than the hitherto known wiring structure can be realized in a facilitated manner. Accordingly, the present invention provides a great contribution to the field of the manufacture of a semiconductor device having a high integration density.

We claim:

1. A method of manufacturing a semiconductor device, comprising steps of:
   forming an insulation film having an opening on a semiconductor substrate;
   filling said opening with an electrically conductive material so as to substantially flatten the top end face of the filled opening;
   forming an intermediate layer of an electrically conductive material having a greater allowable current density than that of a wiring layer, said intermediate layer having a greater area than that of said opening so as to cover at least the surface of said electrically conductive material filling said opening; and
   forming said wiring layer which extends from said intermediate layer onto said insulation film.

2. A method of manufacturing a semiconductor device according to claim 1, wherein said electrically conductive material is selected from a group consisting of W, Ti, Zr, Ta and Mo, nitrides of these metals and alloys of these metals.

3. A method of manufacturing a semiconductor device according to claim 1, wherein the filling of said opening with said electrically conductive material is effectuated through CVD, sputtering, bias sputtering or vacuum evaporation.

4. A method of manufacturing a semiconductor device according to claim 1, wherein said intermediate layer is formed of a material selected from a group consisting of W, Mo, Ti, Zr, Ta, Co and Cr, nitrides of these metals, alloys of these metals, Al-Ti alloy, Al-W alloy, Au and Pt.

5. A method of manufacturing a semiconductor device according to claim 1, wherein said intermediate layer has a film thickness not smaller than 500 Å but less than about 20% of the film thickness of said wiring layer.

6. A method of manufacturing a semiconductor device, comprising steps of:
   forming a first wiring layer on a semiconductor substrate;
   forming a first intermediate layer so as to cover at least a part of said first wiring layer, said first intermediate layer being formed of an electrically conductive material having a greater allowable current density than that of said first wiring layer;
   forming an insulation film having an opening on the surface of said first intermediate layer in such a manner in which a part of said first intermediate layer is exposed through said opening;
   filling said opening with an electrically conductive material so as to substantially flatten the top face of the filled opening;
   forming a second intermediate layer so as to cover at least the surface of said electrically conductive material filling said opening, said second intermediate layer being formed of a material having a greater allowable current density than that of a second wiring layer to be formed thereon and having a greater area than that of said opening; and
   forming said second wiring layer extending from the surface of said second intermediate layer onto the surface of said insulation film.

7. A method of manufacturing a semiconductor device according to claim 6, wherein said electrically conductive material is selected from a group consisting of W, Ti, Zr, Ta and Mo, nitrides of these metals and alloys of these metals.

8. A method of manufacturing a semiconductor device according to claim 6, wherein the filling of said opening with said electrically conductive material is effectuated through CVD, sputtering, bias sputtering or vacuum evaporation.

9. A mehtod of manufacturing a semiconductor device according to claim 6, wherein said intermediate layer is formed of a material selected from a group consisting of W, Mo, Ti, Zr, Ta, Co and Cr, nitrides of these metals, alloys of these metals, Al-Ti alloy, Al-W alloy, Au and Pt.

10. A method of manufacturing a semiconductor device according to claim 6, wherein said intermediate layer has a film thickness not smaller than 500 Å but less than about 20% of the film thickness of said wiring layer.

* * * * *